United States Patent
Fujino

[11] Patent Number: 6,016,088
[45] Date of Patent: Jan. 18, 2000

[54] MAGNETOSTATIC WAVE DEVICE

[75] Inventor: Masaru Fujino, Shiga-ken, Japan

[73] Assignee: Murata Manufacturing Co., Ltd., Japan

[21] Appl. No.: 09/156,477

[22] Filed: Sep. 18, 1998

[30] Foreign Application Priority Data

Sep. 24, 1997 [JP] Japan ................................. 9-258772

[51] Int. Cl.[7] ............................ H01P 1/215; H01F 10/28; H01F 1/00
[52] U.S. Cl. ......................... 333/147; 333/158; 333/202; 252/62.57; 252/62.58; 252/62.56
[58] Field of Search ..................... 333/147, 148, 333/158, 201, 202, 219.2; 252/62.56, 62.57, 62.58

[56] References Cited

U.S. PATENT DOCUMENTS

| | | | |
|---|---|---|---|
| 4,563,236 | 1/1986 | Ross et al. ...................... | 252/62.57 X |
| 4,622,264 | 11/1986 | Hosoe et al. ...................... | 252/62.57 X |
| 4,968,954 | 11/1990 | Ryuo et al. ......................... | 333/193 X |
| 5,449,942 | 9/1995 | Tanno et al. ...................... | 252/62.57 X |
| 5,458,797 | 10/1995 | Konoike et al. ...................... | 252/62.57 |
| 5,701,108 | 12/1997 | Fujii et al. ............................. | 333/202 |
| 5,709,811 | 1/1998 | Satoh et al. ......................... | 333/1.1 X |
| 5,801,604 | 9/1998 | Fujino ..................................... | 333/202 |

*Primary Examiner*—Benny Lee
*Assistant Examiner*—Barbara Summons
*Attorney, Agent, or Firm*—Ostrolenk, Faber, Gerb & Soffen, LLP

[57] ABSTRACT

A magnetostatic wave device comprises a $Y_3Fe_5O_{12}$-based magnetic garnet single crystal film, and the magnetic garnet single crystal film contains indium as a substitute for a part of iron, and having a saturation magnetization ranging from 1,800 G to 3,500 G.

8 Claims, 1 Drawing Sheet

MAGNETOSTATIC WAVE DEVICE

BACKGROUND OF THE INVENTION

1. Field of the Invention

The present invention relates to magnetostatic wave devices, and, more particularly, to magnetostatic wave devices comprising $Y_3Fe_5O_{12}$-based magnetic garnet single crystal films.

2. Description of the Related Art

Generally, a $Y_3Fe_5O_{12}$ (hereinafter referred to as YIG) single crystal, which is a type of a magnetic garnet single crystal film, is an important material for a magnetostatic wave device. In particular, an extremely small ferromagnetic half-width ($\Delta H$) is the most outstanding characteristic of YIG, which leads to minimizing a difference between an input signal and an output signal when used for a magnetostatic wave device. Also, another characteristic of YIG is that a relatively low amount of electrical power causes a saturation phenomenon in relation to an input signal, and by using this characteristic, the YIG single crystal film has been widely used for a magnetostatic wave device such as a limiter or a noise filter. Also, various magnetic garnet single crystal films other than the YIG single crystal film have been similarly used for magnetostatic wave devices.

With respect to the known magnetostatic wave devices using magnetic garnet single crystal films, however, when an input signal has a high frequency, a high amount of electrical power must be input in order to cause the saturation phenomenon.

Therefore, there is a need for a higher performance magnetostatic wave device in which relatively low input electrical power causes the saturation phenomenon even when an input signal has a high frequency.

SUMMARY OF THE INVENTION

The present invention is directed to a magnetostatic wave device that satisfies the aforementioned needs. The magnetostatic wave device comprises a $Y_3Fe_5O_{12}$-type magnetic garnet single crystal film, and the magnetic garnet single crystal film contains indium as a substitute for a part of iron and has a saturation magnetization ranging from 1,800 G to 3,500 G. An effective amount of the In is used to achieve the desired saturation magnetization and this will vary depending on the other elements present. As known, a yttrium/iron-containing magnetic garnet single crystal may also contain La, Lu, etc. In general, 2–20% of the Fe sites in $Y_3Fe_5O_{12}$ is occupied by In atoms.

According to the present invention, by using the $Y_3Fe_5O_{12}$-based magnetic garnet single crystal film, a high performance magnetostatic wave device in which lower input electrical power causes the saturation phenomenon in comparison with the conventionally used device can be obtained.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
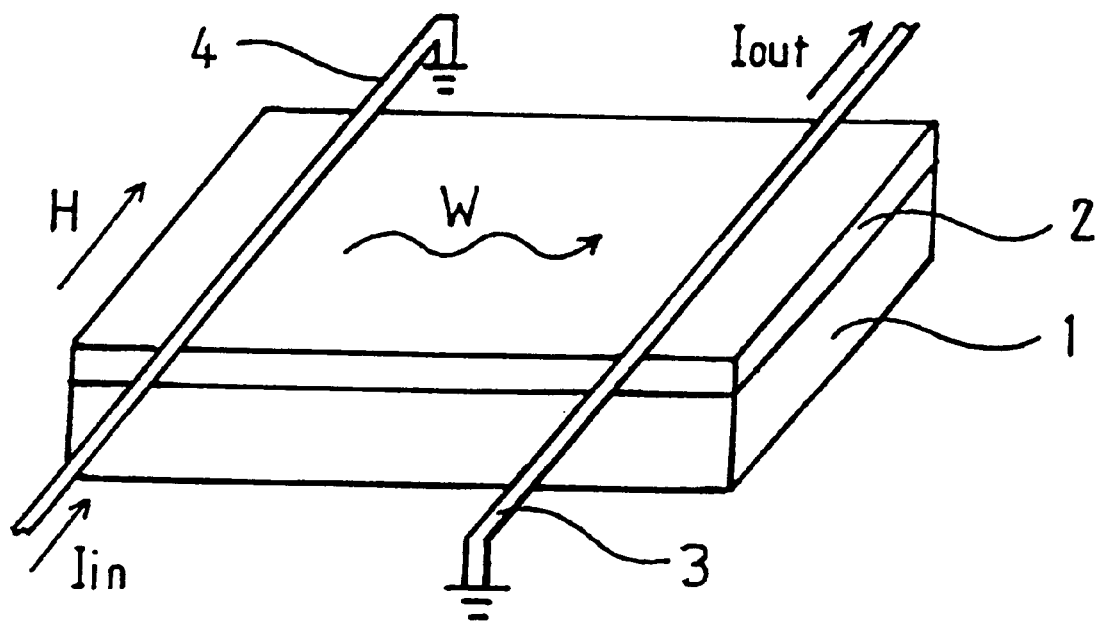
FIG. 1 is a perspective view showing an example of the magnetostatic wave device.

Hereinafter, the preferred embodiments of the present invention are explained in detail with reference to the drawing.

EXAMPLE 1

First, $Fe_2O_3$, $Y_2O_3$, $La_2O_3$, $Lu_2O_3$, $Gd_2O_3$, $Tm_2O_3$, $Bi_2O_3$, $Ga_2O_3$, $Al_2O_3$ and $In_2O_3$ as materials for a magnetic garnet film, and PbO and $B_2O_3$ as solvents were prepared. Also a $Gd_3Ga_5O_{12}$ substrate was prepared as a substrate for forming a magnetic garnet film by a liquid phase epitaxial growth process.

Next, the above materials were selected and weighed so that the magnetic garnet films having the compositions shown in Table 1 were obtained. After adding PbO and $B_2O_3$ as solvents, the materials were filled into a platinum crucible retained in a vertical electric furnace. Then, homogenization and melting were performed by heating at approximately 1,200° C.

After the molten liquid was retained at a constant temperature of approximately 900° C. so as to be supersaturated, a rotating $Gd_3Ga_5O_{12}$ substrate was soaked in the molten liquid in order to grow a garnet film. Then, the substrate was taken out of the molten liquid, and the adhered molten liquid on the garnet film was shaken off by means of a centrifugal force by rotating at high speed, and thus a magnetic garnet single crystal film formed on the substrate was obtained.

TABLE 1

| Sample No. | Composition | Saturation Magnetization (G) | Insertion Loss (dB) | Critical Frequency (GHz) |
|---|---|---|---|---|
| *1 | $Y_3Fe_5O_{12}$ | 1,760 | 7 | 3.8 |
| 2 | $Y_3Fe_{4.0}In_{0.1}O_{12}$ | 1,890 | 9 | 4.2 |
| 3 | $Y_2LuFe_4InO_{12}$ | 3,420 | 9 | 8.1 |
| *4 | $Y_2LuFe_{3.9}In_{1.1}O_{12}$ | 3,600 | 21 | 8.5 |
| 5 | $Y_{2.9}Gd_{0.1}Fe_{4.1}In_{0.5}Ga_{0.4}O_{12}$ | 1,830 | 8 | 4.0 |
| *6 | $Y_{2.9}Gd_{0.1}Fe_{4.0}In_{0.5}Ga_{0.5}O_{12}$ | 1,740 | 9 | 3.7 |
| 7 | $Y_{2.0}Tm_{0.1}Fe_{4.5}In_{0.3}Al_{0.2}O_{12}$ | 1,860 | 7 | 4.1 |
| *8 | $Y_{2.9}Tm_{0.1}Fe_{4.4}In_{0.3}Al_{0.3}O_{12}$ | 1,750 | 8 | 3.8 |
| 9 | $Y_{2.8}La_{0.2}Fe_{3.1}InGa_{0.9}O_{12}$ | 1,860 | 8 | 4.1 |
| *10 | $Y_{2.8}La_{0.2}Fe_3InGaO_{12}$ | 1,760 | 9 | 3.8 |
| 11 | $Y_{2.8}Bi_{0.2}Fe_{3.0}In_{0.6}Al_{0.5}O_{12}$ | 1,880 | 9 | 4.2 |
| *12 | $Y_{2.8}Bi_{0.2}Fe_{3.8}In_{0.6}Al_{0.6}O_{12}$ | 1,750 | 7 | 3.8 |

Next, as shown in FIG. 1, electrodes 3 and 4 were formed on the magnetic garnet single crystal film 2 that had been obtained to fabricate a magnetostatic wave device, and insertion loss and critical frequency which saturates at 0.1 mW were measured. In FIG. 1, numeral 1 represents the substrate of $Gd_3Ga_5O_{12}$, symbol H represents the direction of an applied external magnetic field, symbol $I_{in}$ represents the input direction of a microwave, symbol W represents the propagation direction of a magnetostatic surface wave (MSSW), and symbol $I_{out}$ represents the output direction of a microwave. Also, saturation magnetization was measured by using a sample vibration magnetometer.

The results are summarized in Table 1. The samples marked * in the sample number column are outside of the scope of the present invention, and the rest are within the scope of the present invention.

EXAMPLE 2

First, $Fe_2O_3$, $Y_2O_3$, $La_2O_3$, $Ga_2O_3$ and $In_2O_3$ as materials for a magnetic garnet film, and PbO and $B_2O_3$ as solvents were prepared. Also an $Sm_3Ga_5O_{12}$ substrate was prepared as a substrate for forming a magnetic garnet film by the liquid phase epitaxial growth process.

Next, the above materials were selected and weighed so that the magnetic garnet films having the compositions shown in Table 2 were obtained. After adding PbO and $B_2O_3$ as solvents, the materials were filled into a platinum crucible retained in a vertical electric furnace. Then, homogenization and melting were performed by heating at approximately 1,200° C.

After the molten liquid was retained at a constant temperature of approximately 900° C. so as to be supersaturated, a rotating $Sm_3Ga_5O_{12}$ substrate was soaked in the molten liquid in order to deposit a garnet film. Then, the substrate was taken out of the molten liquid, and the adhered molten liquid on the garnet film was shaken off by means of a centrifugal force by rotating at high speed, and thus a magnetic garnet single crystal film formed on the substrate was obtained.

TABLE 2

| Sample No. | Composition | Saturation Magnetization (G) | Insertion Loss (dB) | Critical Frequency (GHz) |
|---|---|---|---|---|
| *13 | $Y_{2.2}La_{0.8}Fe_5O_{12}$ | 1,750 | 9 | 3.8 |
| 14 | $Y_{2.2}La_{0.8}Fe_{4.9}In_{0.1}O_{12}$ | 1,880 | 9 | 4.2 |
| 15 | $Y_{2.4}La_{0.6}Fe_3InGaO_{12}$ | 3,440 | 8 | 8.4 |
| *16 | $Y_{2.4}La_{0.6}Fe_{2.9}In_{1.1}GaO_{12}$ | 3,610 | 21 | 8.7 |

Next, similarly to example 1, a magnetostatic wave device was fabricated, and insertion loss and critical frequency which saturates at 0.1 mW were measured. Also, saturation magnetization was measured by using a sample vibration magnetometer.

The results are summarized in Table 2. The samples marked * in the sample number column are outside of the scope of the present invention, and the rest are within the scope of the present invention.

EXAMPLE 3

First, $Fe_2O_3$, $Y_2O_3$, $La_2O_3$, $Ga_2O_3$ and $In_2O_3$ as materials for a magnetic garnet film, and PbO and $B_2O_3$ as solvents were prepared. Also an $Nd_3Ga_5O_{12}$ substrate was prepared as a substrate for forming a magnetic garnet film by the liquid phase epitaxial growth process.

Next, the above materials were selected and weighed so that the magnetic garnet films having the compositions shown in Table 3 were obtained. After adding PbO and $B_2O_3$ as solvents, the materials were filled into a platinum crucible retained in a vertical electric furnace. Then, homogenization and melting were performed by heating at approximately 1,200° C.

After the molten liquid was retained at a constant temperature of approximately 900° C. so as to be supersaturated, a rotating $Nd_3Ga_5O_{12}$ substrate was soaked in the molten liquid in order to deposit a garnet film. Then, the substrate was taken out of the molten liquid, and the adhered molten liquid on the garnet film was shaken off by means of a centrifugal force by rotating at high speed, and thus a magnetic garnet single crystal film formed on the substrate was obtained.

TABLE 3

| Sample No. | Composition | Saturation Magnetization (G) | Insertion Loss (dB) | Critical Frequency (GHz) |
|---|---|---|---|---|
| *17 | $Y_{1.7}La_{1.3}Fe_5O_{12}$ | 1,740 | 8 | 3.7 |
| 18 | $Y_{1.7}La_{1.3}Fe_{4.9}In_{0.1}O_{12}$ | 1,900 | 8 | 4.1 |
| 19 | $Y_2LaFe_3GaInO_{12}$ | 3,500 | 9 | 8.3 |
| *20 | $Y_2LaFe_{2.9}GaIn_{1.1}O_{12}$ | 3,630 | 20 | 8.5 |

Next, similarly to example 1, a magnetostatic wave device was fabricated, and insertion loss and critical frequency which saturates at 0.1 mW were measured. Also, saturation magnetization was measured by using a sample vibration magnetometer.

The results are summarized in Table 3. The samples marked * in the sample number column are out of the scope of the present invention, and the rest are within the scope of the present invention.

As illustrated in examples 1 to 3, the magnetostatic wave device in accordance with the present invention comprises a $Y_3Fe_5O_{12}$-based magnetic garnet single crystal film which contains indium as a substitute for a part of iron and has a saturation magnetization ranging from 1,800 G to 3,500 G, has high performance characteristics, that is, an input electrical power of 1 mW or less causes a saturation phenomenon even with respect to a high-frequency input signal of 4 GHz or more.

In contrast, as exhibited in the sample numbers 1, 6, 8, 10, 12, 13, and 17, when saturation magnetization is less than 1,800 G, the critical frequency decreases to 3.8 GHz or less, which is undesirable. On the other hand, as exhibited in the sample numbers 4, 16, and 20, when saturation magnetization exceeds 3,500 G, the insertion loss increases to 20 dB or more, and thereby a device having satisfactory characteristics is not obtainable.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A magnetostatic wave device comprising a $Y_3Fe_5O_{12}$-based magnetic garnet single crystal film, said magnetic garnet single crystal film containing indium as a substitute for a part of iron, and having a saturation magnetization ranging from 1,800 G to 3,500 G, wherein the magnetostatic wave device has an insertion loss less than 20 dB and has a critical frequency more than 3.8 GHz at which a saturation phenomenon is caused by an input electrical power of 1 mW.

2. The magnetostatic wave device of claim 1 disposed on a $Gd_3Ga_5O_{12}$, $Sm_3Ga_5O_{12}$ or $Nd_3Ga_5O_{12}$ substrate.

3. The magnetostatic wave device of claim 1 wherein the magnetic garnet single crystal film is selected from the group consisting of $Y_3Fe_{4.0}In_{0.1}O_{12}$, $Y_{2.9}Gd_{0.1}Fe_{4.1}In_{0.5}Ga_{0.4}O_{12}$, $Y_{2.0}Tm_{0.1}Fe_{4.5}In_{0.3}Al_{0.2}O_{12}$, $Y_{2.8}La_{0.2}Fe_{3.1}InGa_{0.9}O_{12}$, $Y_{2.8}Bi_{0.2}Fe_{3.0}In_{0.6}Al_{0.5}O_{12}$ and $Y_{2.2}La_{0.8}Fe_{4.9}In_{0.1}O_{12}$.

4. The magnetostatic wave device of claim 3 disposed on a $Gd_3Ga_5O_{12}$, $Sm_3Ga_5O_{12}$ or $Nd_3Ga_5O_{12}$ substrate.

5. The magnetostatic wave device of claim 1 wherein the magnetic garnet single crystal film is selected from the group consisting of $Y_2LuFe_4InO_{12}$, $Y_{2.4}La_{0.6}Fe_3InGaO_{12}$, $Y_{1.7}La_{1.3}Fe_{4.9}In_{0.1}O_{12}$ and $Y_2LaFe_3GaInO_{12}$.

6. The magnetostatic wave device of claim 5 disposed on a $Gd_3Ga_5O_{12}$, $Sm_3Ga_5O_{12}$ or $Nd_3Ga_5O_{12}$ substrate.

7. The magnetostatic wave device of claim 1 wherein 2–20% of Fe sites of $Y_3Fe_5O_{12}$ is occupied by In atoms.

8. The magnetostatic wave device of claim 7 disposed on a $Gd_3Ga_5O_{12}$, $Sm_3Ga_5O_{12}$ or $Nd_3Ga_5O_{12}$ substrate.

* * * * *